United States Patent [19]
Tohyama et al.

[11] Patent Number: 5,718,595
[45] Date of Patent: Feb. 17, 1998

[54] SOCKET APPARATUS

[75] Inventors: Masao Tohyama, Gotemba; Kiyokazu Ikeya, Shizuoka-ken; Takashi Tonooka, Susono, all of Japan

[73] Assignee: Texas Instruments Incorporated, Dallas, Tex.

[21] Appl. No.: 562,141

[22] Filed: Nov. 22, 1995

[30] Foreign Application Priority Data

Dec. 2, 1994 [JP] Japan .................. 6-329678

[51] Int. Cl.$^6$ .................................................. H01R 13/62
[52] U.S. Cl. .................................................. 439/330
[58] Field of Search .................. 439/72, 73, 330, 439/70, 71

[56] References Cited

U.S. PATENT DOCUMENTS

| | | |
|---|---|---|
| 4,341,429 | 7/1982 | Bright et al. |
| 5,199,890 | 4/1993 | Kubo ............................ 439/72 |
| 5,228,866 | 7/1993 | Espenshade et al. |
| 5,460,538 | 10/1995 | Ikeya ............................ 439/73 |
| 5,531,608 | 7/1996 | Abe ............................ 439/330 |

FOREIGN PATENT DOCUMENTS

| | | |
|---|---|---|
| 0 282 296 A | 9/1988 | European Pat. Off. |
| 0 457 472 A1 | 11/1991 | European Pat. Off. |
| 0 622 982 A1 | 2/1994 | European Pat. Off. |
| 2 251 134 | 6/1992 | United Kingdom . |

*Primary Examiner*—Khiem Nguyen
*Assistant Examiner*—Eugene G. Byrd
*Attorney, Agent, or Firm*—Russell E. Baumann; Richard L. Donaldson; Rene' E. Grossman

[57] ABSTRACT

A socket for removably mounting an electric part such as an IC package (30) has a cover (14) which when pushed down from a raised at rest position causes a drive shaft (26) fixed to the cover (14) to move down rotating a first lever (36) and actuating a second lever (38). Upon such rotation a latch (48) moves to a receded position which is obliquely above a plurality of contact elements (28) and, at the same time, vertically movable arms (50) rise to a selected vertical position from a cavity (52). The IC package (30) is then received on the vertically movable arms (50). When the downward force on the cover (14) is removed, cover (14) and the drive shaft (26) rise, first lever (36) and second lever (38) start moving in an opposite direction and the vertically movable arms (50) move down carrying the IC package (30), with a result that each terminal lead (32) of the IC package engages and rides on a contact portion (28f) of each contact element (28, 28') corresponding thereto and the latch (48) engages the terminal leads disposed on the contact portions (28f) in such a fashion as to sandwich the leads (32) and apply an additional contact force to the leads (32).

21 Claims, 11 Drawing Sheets

SOCKET APPARATUS

BACKGROUND OF THE INVENTION

1. Field of the Invention

This invention relates generally to sockets for removably loading electric parts such as integrated circuit packages or the like, thereby obtaining an electric connection with the electric parts.

2. Description of Related Art

Generally, plastic encapsulated packages containing semiconductor integrated circuit chips (hereinafter referred to as IC chips) are subjected to an electrical property test and/or a burn-in reliability test prior to shipment from a semiconductor manufacturing plant in order to separate satisfactory from unsatisfactory product. In the electric property test, the input/output properties of the IC chip, its pulse characteristics and its noise leeway and the like, are tested. In the burn-in test, those IC packages which pass the electric property test are placed in an oven and energized for a selected period of time at an elevated temperature, for example, 120° centigrade, and under an electric voltage source which is approximately 20 percent higher than the rated value. Those IC packages which do not perform satisfactorily in the burn-in test are discarded and only those other IC packages which continue performing regularly are shipped out as satisfactory products.

Generally, in order to perform the burn-in test, the IC package is loaded in a socket which is installed on a printed circuit substrate. Respective contacts provided in the socket engage the leads of the IC package in a 1:1 relationship in order to electrically connect the IC package to a testing device through the printed circuit substrate.

An example of a prior art socket employed for such burn-in tests is shown in FIGS. 19 and 20. FIG. 19 is a perspective view showing the structure of a conventional socket as a whole and FIG. 20 is a cross sectional view of a portion of the socket showing the construction of the essential part thereof. The socket comprises a base 100 as a main socket body to be fixed on the printed circuit substrate (not shown in the drawings) and a cover 102 adapted for vertical movement toward and away from base 100. An opening 106 is provided at the center of the upper surface of cover 102 for the removal and insertion of an IC package 104 out of and into the socket. A guide hole 107 is provided at each corner of the upper surface of the cover for reception of a guide column 101 that extends vertically upwardly at each corner of base 100.

The upper surface 100a of base 100 is adapted to receive thereon an IC package 104 of the SOP (small outline package) type having gull wing type leads 104a. A corner guide wall 108 having a horizontal cross section in the shape of an L for guiding the corner part of the IC package 104 is disposed at each corner of IC package seating surface 100a of base 100. A rib 110, also L shaped, is provided on the upper surface of base 100 inside each corner wall 108 on base 100 for positioning the IC package.

When IC package 104 is positioned on base 100 as shown in FIG. 20, the bent contact tip of each lead 104a of IC package 104 will be disposed approximately horizontally on the upper lead receiving surface 100b of base 100 situated adjacent to and beyond rib 110. A large number of contacts 112 are arranged in base 100 beyond lead receiving surface 100b at a pitch corresponding to the lead terminal row of the SOP type IC package.

Each contact element 112 is formed from a thin sheet of suitable material such as beryllium copper, as by stamping or the like. Contact element 112 comprises a base portion 112a inserted into and fixed in a groove 100d of the contact support portion 100c of base 100, a socket terminal pin 112f which extends vertically downwardly from base portion 112a, an arched spring portion 112b that curves upwardly from the top of base portion 112a, a lever portion 112c that extends in a straight line from the top part of arched spring portion 112b, a lead holding portion 112d that extends laterally from the top of the arched spring portion 112b toward IC package receiving surface 100b and a hook-shaped contact portion 112e formed at the distal end of leading holding portion 112d.

The distal end of lever 112c engages an inclined surface 114a of a cam 114 provided on the lower surface of cover 102. When cover 102 moves perpendicularly relative to base 100, the distal end of lever portion 112c moves in conformity with the inclined sliding surface 114a of cam 114 displacing lever portion 112c. Partition walls 118 are disposed along the outer periphery of lead receiving surface 100b of base 100 in order to prevent contact portion 112e of each contact element 112 from contacting respective adjacent contact elements 112.

Next, the operation of each part will be explained by referring to FIG. 20 as an IC package is loaded in the socket. First, with no IC package present, cover 102 is pushed down from the solid line position to the broken line position. Cam portion 114 of cover 102 moves down with the cover from the solid line position to the broken line position and lever portion 112c is displaced from the solid line position to the broken line position in conformity with the inclined sliding surface 114a of cam 114. Arched spring portion 112b and the lead holding portion 112d, in dependence upon the displacement of lever portion 112c, are also displaced from the solid line position to the broken line position and the contact portion 112e at the distal end of the lead holding portion 112d is displaced obliquely upwardly and outwardly out of engagement with lead receiving surface 100b.

With contact part 112e of contact element 112 moved away from lead receiving surface 100b in this manner, an IC package 104 is inserted into the socket through opening 106 of cover 102. IC package 104 is guided by the inside inclined surface 108a of the corner guide wall 108 and is positioned on base 100 by means of rib 110 with the bent contact tip of each lead 104a of IC package 104 received at a selected location on the lead receiving surface 100b.

The downward force on cover 102 is then removed with the cover rising to its original position by the return force of the arched spring portions 112b of the contact elements 112. In this manner, contact elements 112 are restored essentially to their original position and contact portions 112e of the lead holding portions 112d engage the bent contact tips of respective leads 104a of IC package 104, thereby making electrical contact therewith. Because of this, the return movement of contact elements 112 is limited by the thickness of leads 104a, with a consequence that the lead holding portions 112d are somewhat bent and the contact portions 112e engage the bent contact tips of leads 104a under added force by the spring force of the curved spring portions 112b as well as the lead holding portions 112d. FIG. 20 shows the state in which an electric connection has been effected between IC package 104 and the socket.

When it is desired to remove IC package 104 from the socket, cover 102 is pushed down toward base 100 once again. Cover 102 and contact elements 112 return to the broken line positions and the contact portions 112e of contact elements 112 separate from leads 104a of IC package 104. Then, IC package 104 can be extracted by means of a pair of tweezers.

In the conventional socket, as described above, contact elements 112 are directly moved by a moving cam mechanism comprising the cam 114 of cover 102 and lever portions 112c of contact elements 112. Due to the large number of contact elements, a considerably large operating force on the cover is required to move each contact element 112 from the solid line position to the dashed line position. It is possible to reduce this operating force by decreasing the spring force of lever portions 112c by increasing their length or by increasing the angle of cam 114 of cover 102. In such case, however, the amount of movement of cover 102 or the outer configuration of the socket would increase. If lever portions 112c of contact elements 112 are made longer, moreover, contact elements 112 would tend to warp, thereby increasing the possibility of contacting adjacent contact elements thereby creating a short circuit.

In the conventional socket, moreover, IC package 104 is placed on base 100 by releasing the package a certain distance above opening 106. There is a possibility in connection with this dropping of the package, if the package is tilted, for example, for one of the leads 104a of IC package 104 to hit lead receiving surface 100b of base 100 before the other leads, thereby bending or deforming one or more leads 104a.

Further, if the downward force exerted on cover 102 is not properly balanced, there is a possibility that the cover could be pressed down in a skewed orientation with the force applied to contact elements 112 from cam 114 of cover 102 becoming uneven on opposite sides of IC package 104. As a result, contact elements 112 on one side (in one row) may be in engagement with corresponding leads 104a under sufficient force while contact elements on the other side (row) may not have satisfactory contact force with corresponding leads 104a.

SUMMARY OF THE INVENTION

An object of the present invention is to provide a socket apparatus which overcomes the above noted prior art limitations. Another object of the invention is the provision of a socket which provides stable, consistent and accurate electric contact engagement having relatively high contact force yet using less operating force than that required in conventional sockets while reducing the size of the socket relative to conventional sockets.

Briefly, a socket made in accordance with a first embodiment of the invention comprises a main socket body for removably loading a selected electric part having a package that contains an electric circuit and a plurality of connective terminal leads that extend outwardly from sides of the package, a plurality of contact elements mounted in the main socket body so that each will be electrically connected with a respective one of the plurality of terminal leads of the electric part in a 1:1 relationship, a linkage mechanism which moves in alternating directions in response to a selected external force and a latch member which, in dependence upon the linkage mechanism, moves between a first position in engagement with the contact elements and a second position out of engagement with and away from the contact elements. The latch member, in moving from the first position to the second position, allows the electric part to be loaded in or to be removed from the main socket body and, in dependence upon the return movement of the linkage mechanism, the latch member moves from the second position to the first position, thereby causing the terminal leads of each electric part that is loaded in the main socket body to engage their respective contact elements under additional force.

According to a feature of the invention, the socket has a support member which is integrally connected to the latch member which receives the lower surface of the electric part package that has been loaded in the main socket body when the latch member is at the second position and that moves down, while carrying the electric part, in dependence upon the movement of the latch member from the second position to the first position, thereby guiding the package to the prescribed electric part loading position without subjecting the package to jarring or shocking.

According to a modified embodiment of the invention, a positioning member is integrally attached to the latch member so that when the electric part is loaded into the main socket body, the positioning member passes through a gap between adjacent connective terminal leads at a selected location of the electric part to thereby accurately position the electric part.

According to a modified embodiment of the invention, a guiding means is integrally attached to the latch member for guiding the electric part to a selected location by means of sliding contact with corners of the package of the electric part when the electric part is loaded into the main socket body.

According to another feature of the invention, a cover may be provided on the main socket body vertically movable through spring members with the linkage mechanism linked to the cover. When the cover is pushed down in opposition to the spring members, the linkage mechanism engages in a first movement and, as the cover rises to its original position by the return force of the spring members when the downward force is removed, the linkage mechanism engages in a second opposite return movement.

According to yet another feature of the invention, the linkage mechanism has a drive shaft vertically movable approximately at the center of the main socket body and linked to the cover. A pair of lever means are rotatably mounted on the main socket body with one of the pair disposed on each side of the drive shaft, with each one having an end portion linked to the drive shaft and an opposite end portion linked to the latch member.

According to a feature of the invention, the pair of lever means includes a pair of first lever members having one end portion of each linked to the drive shaft, and a second lever member rotatably and slidingly disposed having a selected orientation in the main socket body on both sides of the drive shaft, one end portion of each second lever member being connected to the other end portion of the respective first lever members and, at the same time, the other end of each second lever member being connected to a respective latch member.

The provision of the lever members and the latch member on both sides of the main socket body engaging in the same movement at the same time, with the drive shaft as the center, results in a stable and accurate additional force contact engagement between each terminal lead of the electric part and a respective contact element even if the cover body is pressed down in a skewed orientation.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
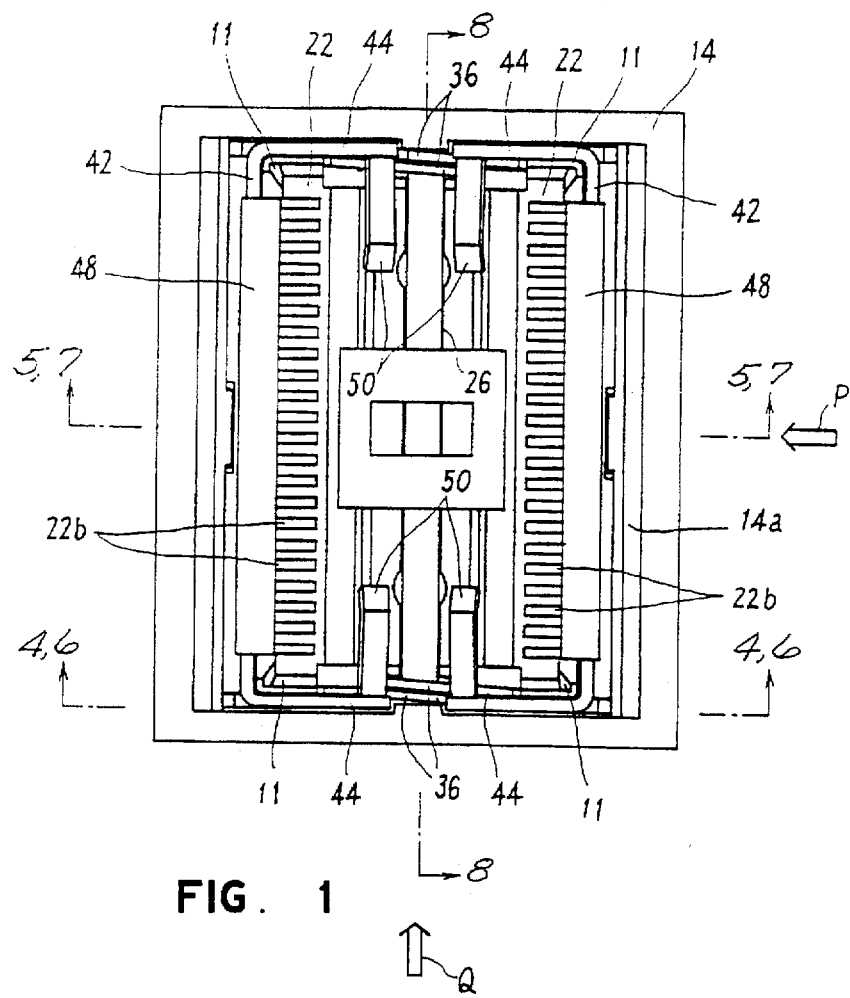
FIG. 1 is a top plan view showing the outer construction of a burn-in test socket made in accordance with a first embodiment of the invention.

Referring to FIGS. 1–8 which show a burn-in test socket made in accordance with a first embodiment of the invention, the socket comprises a generally square base 10 as a main socket body to be fixed on a printed circuit substrate (not shown in the drawings) and a cover 14 in the shape of a square frame vertically movable through compression coil springs 12 toward and away from base 10. Both base 10 and cover 14 are formed of suitable electrically insulative plastic material.

A plurality of pins 16, 16', seven being shown in FIGS. 2–6, extend perpendicularly downwardly from two mutually opposing sides of cover 14. In this embodiment, pin 16' at the center has a diameter which is larger than pins 16.

A compression coil spring 12 is disposed around each of the two pins 16 closest to center pin 16' on both sides thereof. Guide bores or grooves 18, 18' capable of receiving each respective pin 16, 16' therein are formed at the edges on both sides of the base 10 in alignment with respective pins 16, 16'.

Figure 2:
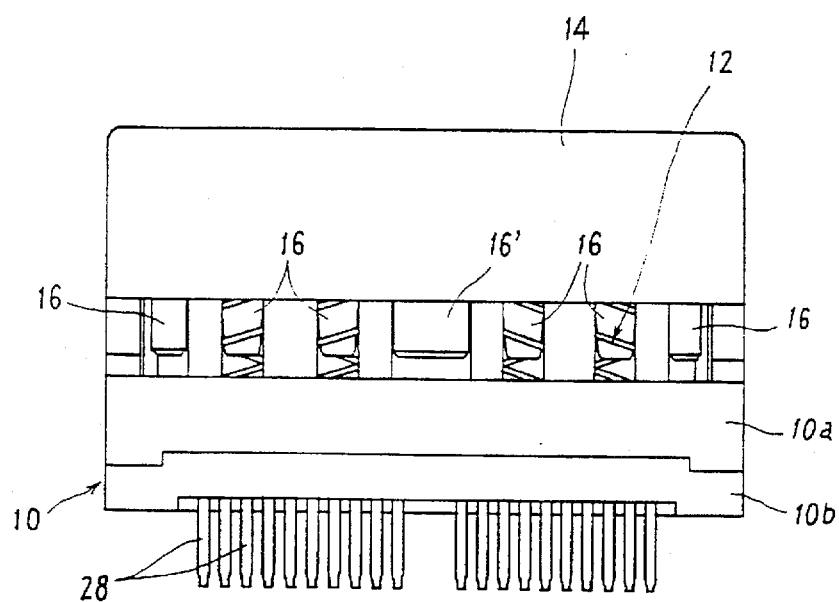
FIG. 2 is a side elevational view of the FIG. 1 socket as seen from the direction indicated by arrow P in FIG. 1.
Figure 3:
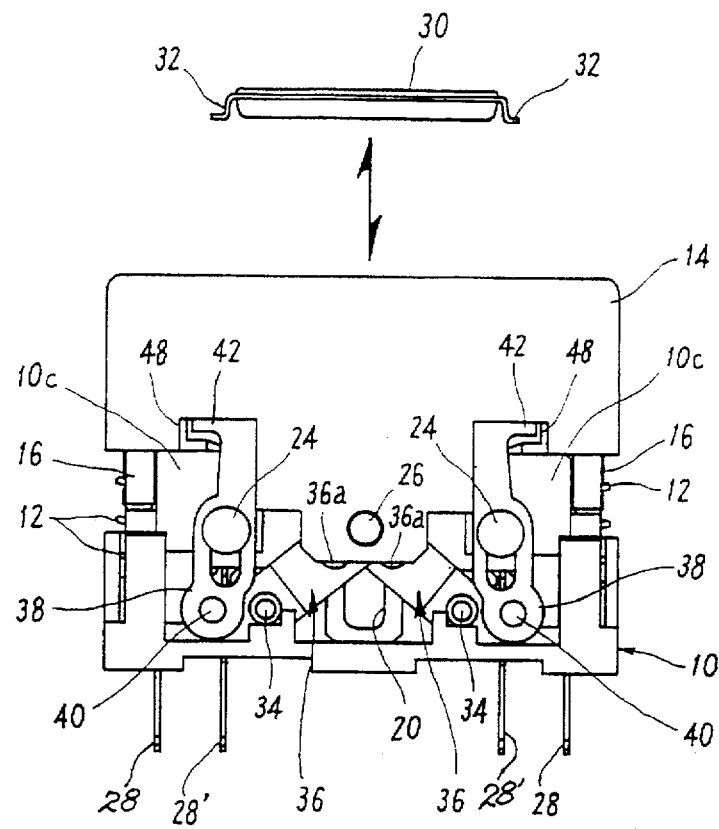
FIG. 3 is a front elevational view of the FIG. 1 socket as seen from the direction indicated by arrow Q in FIG. 1 and shown with an electric part about to be received in or removed from the socket.

If a downward force is applied to cover 14 when in the position shown in FIGS. 2 and 3, each compression coil spring 12 is compressively deformed and pins 16 and 16' enter respective guide bores 18 and 18' as cover 14 moves downwardly to its lower position contiguous to base 10. When the downward force is removed, pins 16 and 16' move out of guide bores 18 and 18' respectively by the return force of the compression coil springs 12 with cover 14 moving to its at rest, original position away from base 10 (the position shown in FIGS. 2 and 3).

Base 10 is shown as an integral combination of an upper base 10a and a lower base 10b as seen in FIGS. 4 through 7. A drive shaft guide groove 20 is formed in the lower portion of the center of upper base 10a for guiding drive shaft 26 of the linkage mechanism in vertical directions, as will be described below. Contact chambers 22 and guide bores 18, 18' for the guidance of the vertical movement of the cover as described above, are formed on both sides of drive shaft guide groove 20. Rivets or pins 24 are fixed to front and back sides 10c of the upper base 10a on both sides of guide groove 20.

Each contact chamber 22 receives a contact element 28 therein and is defined on opposed sides by partition walls 22a. The number, position and pitch of contact elements 28 correspond to the arrangement of leads 32 of the IC package 30 to be loaded in the socket. In the upper portion of each contact chamber 22, there is provided a window 22b for upwardly exposing each contact element 28. On the lower portion of each contact chamber 22, moreover, there is formed an opening 22c for allowing each contact element 28 to pass through the lower surface of the socket (the side of the printed circuit substrate).

A corner guide wall 11 having a generally L-shaped horizontal cross sectional configuration and an inner inclined surface for guiding the corner part of an IC package 30 is disposed at each corner portion of the upper surface of upper base 10a.

Figure 5:
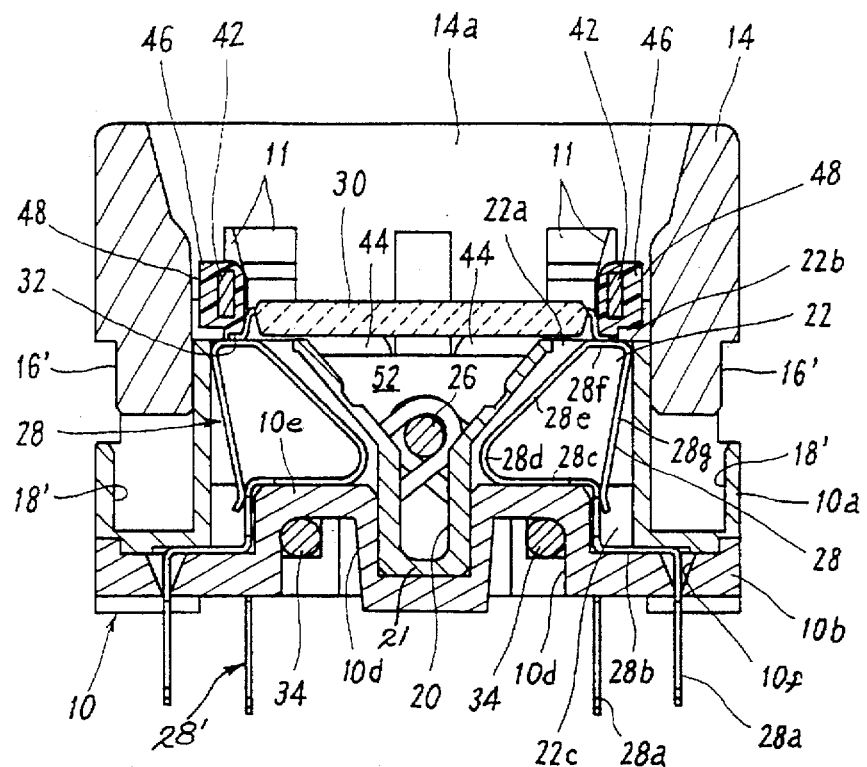
FIG. 5 is a cross sectional view taken on line 5,7—5,7 in FIG. 1.
Figure 6:
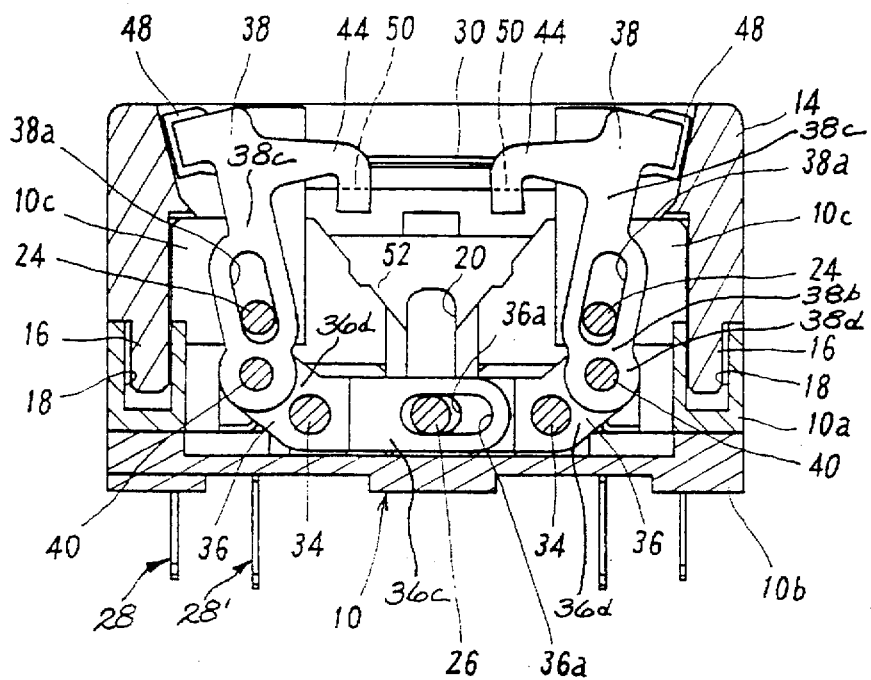
FIG. 6 is a cross sectional view taken on line 4,6—4,6 in FIG. 1 shown with the cover pushed down to its lower position.

A pair of upwardly extending bosses 10d, whose longitudinal cross section forms a generally U-shaped configuration, is provided at the center of lower base 10b. Portion 21 of upper base 10a defining drive shaft guide groove 20 is telescopically received between bosses 10d as seen in FIG. 5. The upper surface 10e of each boss 10d constitutes the bottom of each contact chamber 22 of upper base 10a as described above. A stationary shaft 34 of the linkage mechanism is horizontally mounted within each boss 10d and extends from front to back along the length of lower base 10b.

A contact element receiving aperture 10f is formed in the bottom wall of lower base 10b for each contact element 28. Apertures 10f are located at that portion of the bottom wall which extends from bosses 10d to the outer peripheral side of the socket. Apertures 10f are located in alignment with the guide bores 18 and 18' for a first type of contact element 28. Each contact element 28 of the first type is fixed in place in chamber 22 by engagement of upper base 10a with a horizontally extending part of L-shaped portion 28b of each contact element with terminal portion 28a received through a respective aperture 10f passing through to the lower surface of the socket.

The L-shaped lower linkage portion 28b extends into the contact chamber 22 through a lower opening 22c of the contact chamber 22. A horizontal extending linkage portion 28c extends from the top of the lower linkage portion 28b toward the center of the socket in contact chamber 22 along upper surface 10e of boss 10d of lower base 10b. A straight line spring portion 28e inclines in a straight line diagonally upwardly toward upper opening 22b of contact chamber 22 through a curved spring portion 28d from the horizontal linkage portion 28c. Contact portion 28f, extending from spring portion 28e, inclines upwardly in a straight line at an angle which is somewhat smaller than the angle which straight line spring portion 28e makes with a horizontal line. Contact portion 28f extends from the top of the straight line spring portion 28e away from the center toward the side of the socket and an auxiliary linkage portion 28g extends downwardly in a straight line from the contact portion 28f to the vicinity of the upper end of the lower linkage portion 28b. The free distal end of the auxiliary linkage portion 28g is bent and the said bent portion is adapted to slide against the top vertically disposed part of the lower linkage portion 28b.

A second type of contact element 28' is placed alternately with contact elements 28 in each row. Contact elements 28' are identical to contact elements 28 except that they are provided with a straight, vertically extending, lower linkage portion aligned with respective apertures 10f (not shown), instead of the L-shaped lower linkage portion 28b, so that the socket terminal portions 28a of the contact elements 28, 28' are provided in a zigzag arrangement on the lower surface of the socket. Both types of contact elements 28 and 28' are formed of suitable electrically conductive material having good spring characteristics.

Figure 4:
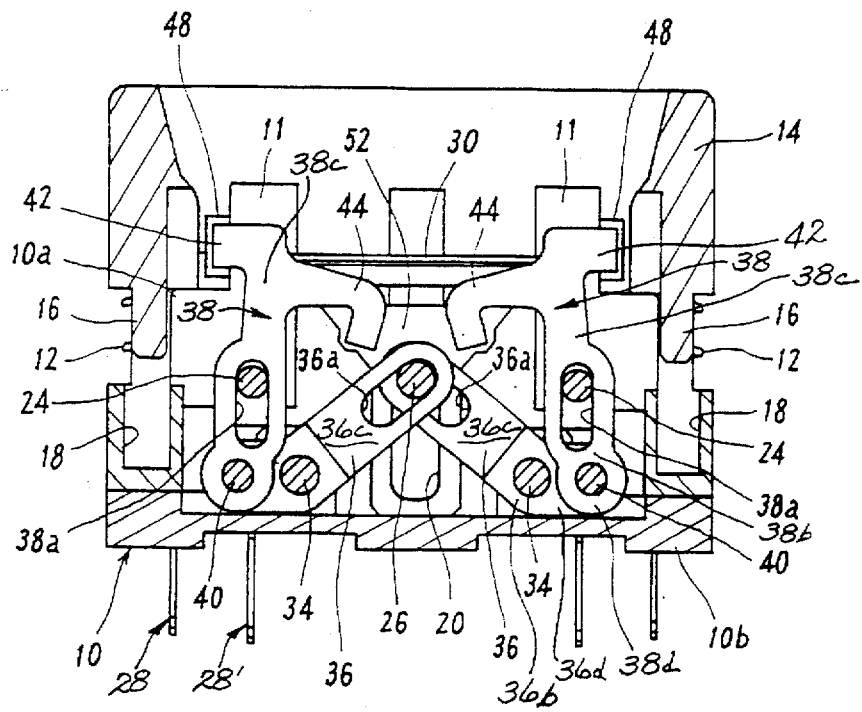
FIG. 4 is a cross sectional view taken on line 4,6—4,6 in FIG. 1 shown with the cover at its at rest, original position.

The linkage mechanism comprises two sets of first and second pairs of lever members. In order to simplify the description, a first and second lever member of each pair of one set will be described, however, it will be understood that the description applies as well to the other members of each pair as well as to the other set. As shown in FIGS. 3 and 4, an intermediate part 36b of first lever 36 is rotatably mounted on shaft 34 fixed to lower base 10b. Drive shaft 26 is freely received through an elongated slot 36a formed at the end of a long arm 36c of lever 36. An elongated slot 38a formed between an intermediate part 38b and an end of a long arm 38c of a second lever 38 freely receives rivet 24 fixed to upper base 10a, with the end of a short arm 38d of second lever 38 rotatably connected to the end of a short arm 36d of first lever 36 by means of a rivet Long arm 38c of second lever 38 extends to a position above the top of the contact elements 28. A latch core 42 connected to the end of each long arm 38c extends in the direction of the contact arrangement and an integrally formed elevator support arm 44 extends from each arm 38c toward the center of the socket outside corner guide walls 11 at the front and back ends of the socket.

Figure 7:
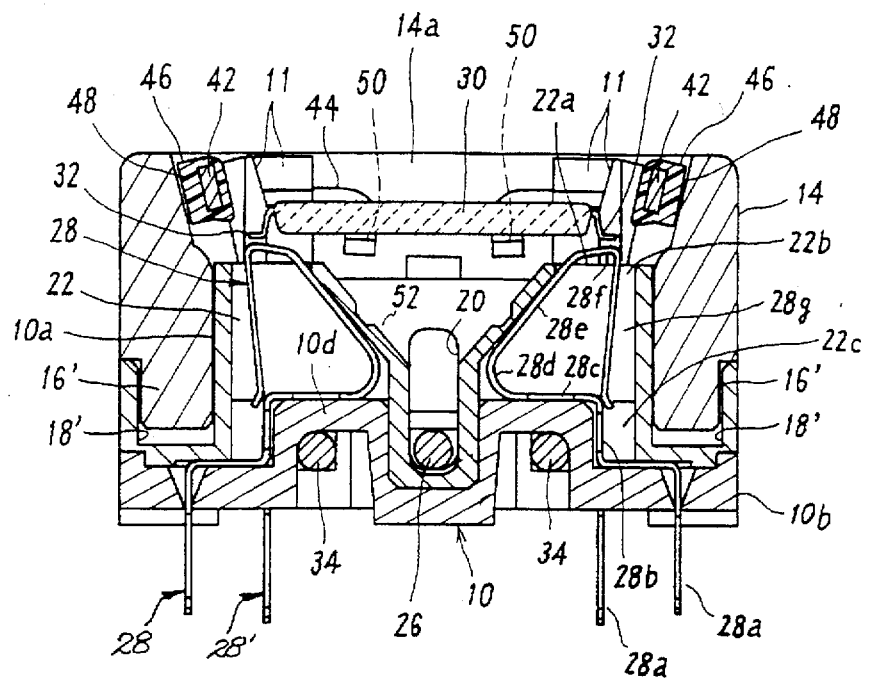
FIG. 7 is a cross sectional view taken on line 5,7—5,7 in FIG. 1 shown with the cover pushed down to its lower position.
Figure 8:
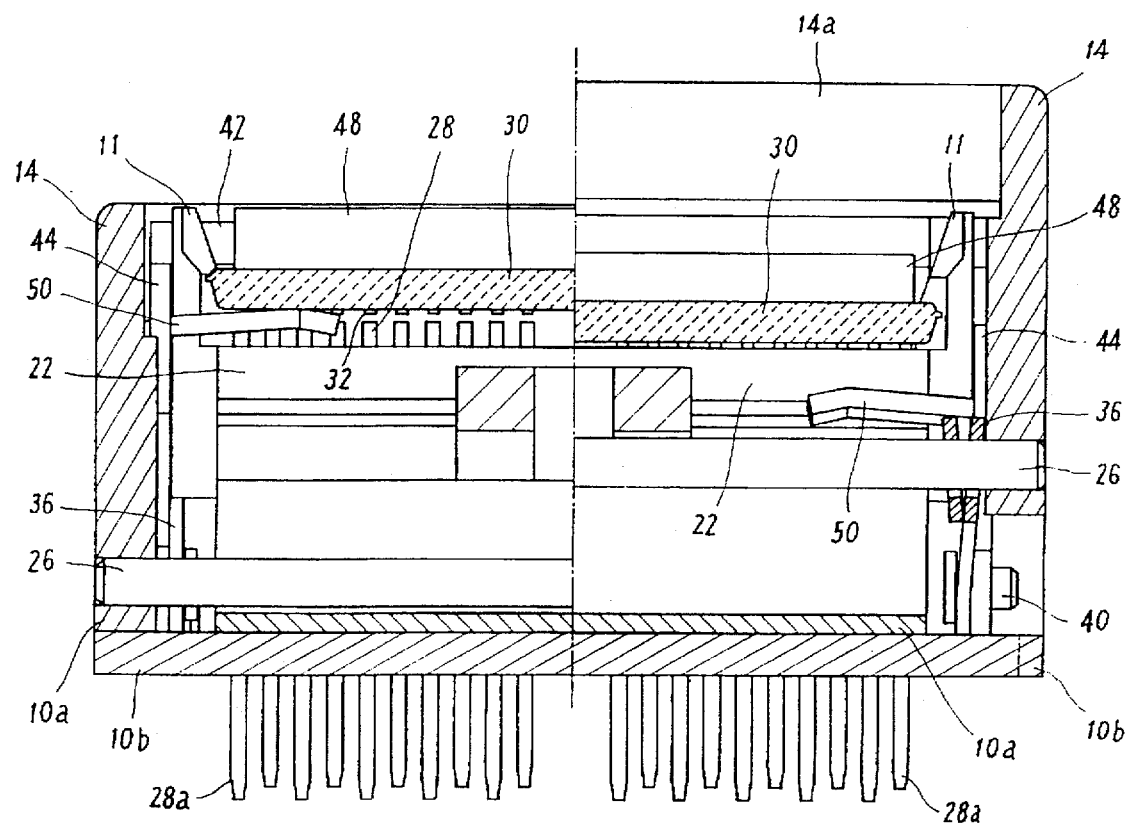
FIG. 8 is a cross sectional view taken on line 8—8 in FIG. 1 shown with the cover at its at rest, original position (right half) and at its pushed down lower position (left half)

As shown in FIGS. 5 and 7, latch core 42 is encapsulated by an insulator 46 made of suitable electrically insulative material such as plastic, thereby constituting a latch 48. As shown in FIGS. 1, 7 and 8, moreover, a vertically movable support arm 50 extends from the outer end of the support arm 44 inwardly toward the center of the socket.

Next, the operation of each part will be explained when an IC package is loaded in the socket. As can be seen in FIGS. 4 and 5, drive shaft 26 is located adjacent the top of guide groove 20 when cover 14 is at its at rest, original position. The long arm 36c of first lever 36 extends diagonally or obliquely upwardly with drive shaft 26 located toward the upper end of slot 36a and the short arm 36d is disposed approximately horizontally along the bottom wall of lower base 10b.

Each second lever 38 is generally vertically disposed with the lever as a whole being located at its lowest position and the fixed rivet 24 near the top of slot 38a of lever 38. In this position, latch 48 engages the contact parts 28f of the contact elements 28 with a predetermined compressive force. The vertically movable support arms 50 move into a cavity 52 whose vertical cross section is generally in the shape of V above the drive shaft guide groove 20 formed by the inclined walls on both sides of the center of the socket in the contact chamber 22.

Initially, when cover 14 is depressed in the absence of an IC package, drive shaft 26, fixed to cover 14, is lowered vertically in guide groove 20 while moving toward the bottom of slot 36a of the long arm 36c of first lever 36. As a result of this, the first lever 36 rotates with its long arm 36c assuming approximately a horizontal position and the short arm 36d obliquely rising off the bottom wall of the base as shown if FIG. 6.

When the first lever 36 rotates in this manner and when short arm 36d rotates away from the bottom wall of the base, the second lever 38 as a whole is lifted vertically and pivoted in an orientation which is dictated by slot 38a and fixed rivet 24 along with movable rivet 40. In this position, long arm 38c is somewhat inclined toward the peripheral side of the socket.

Latch 48 moves in linkage with the movement of second lever 38 from the position engaging contact portions 28f to an obliquely upward or receded position and, at the same time, arms 50 rise generally vertically to a selected position above cavity 52. It is mentioned in this connection that the top inside surface of cover 14 which opposes the latch 48 is formed with a taper to permit movement of latch 48 to its receded position.

With latch 48 moved obliquely upwardly away from the contact portions 28f as described above, an IC package 30 is inserted in an approximately horizontal position into the socket from the top of the cover through opening 14a. As a consequence of this, IC package 30 is guided to the movable support arms 50 by the inclined surfaces of the corner guide walls 11. As shown in FIG. 7, movable support arms 50 receive the lower surface of IC package 30 at a selected vertical position with each terminal lead 32 of the IC package 30 positioned immediately above each contact element 28 corresponding thereto.

After the IC package 30 has been loaded into the socket as described above, the downward force on cover 14 is removed allowing the linkage mechanism to return to its original position. In other words, when the downward force is removed, cover 14 is raised by the return force of compression coil springs 12 and drive shaft 26 rises vertically within guide groove 20 while it moves to the top portion in slot 36a of long arm 36c of the first lever 36.

As a result, the first lever 36 rotates in a direction which is opposite to when the cover was depressed and, as shown in FIG. 4, long arm 36c returns to its diagonally upward orientation, with short arm 36d assuming approximately a horizontal position. When the first lever 36 rotates in this manner and when its short arm 36d rotates to its horizontal position second lever 38 as a whole is lowered in approximately a vertical orientation but with long arm 38c pivoting toward the center of the socket in an orientation which is dictated by slot 38a and the fixed rivet 24 along with movable rivet 40.

In linkage with the rotating and descending movement of lever 38, latch 48 and movable support arms 50 shift to their original positions. Latch 48 once again moves toward the center of the socket from the receded position and then moves vertically downwardly toward the position where it would engage the contact portions 28f, i.e., its at rest, original position. Along with movement of latch 48, movable support arms 50 are lowered carrying IC package 30 from the receiving position and, as each terminal lead 32 is received on the contact portion part 28f corresponding thereto, arms 50 separate from the IC package 30 and return into cavity 52.

As a consequence of the above, when each terminal lead 32 of IC package 30 rides on a contact portion 28f of a respective contact element, latch 48 engages it immediately thereafter, with each terminal lead 32 engaging a respective contact portion 28f with additional compressive force from latch 48. Contact portions 28f move downwardly with curved spring portions 28d and the straight line spring portions 28e being elastically displaced from the FIG. 7 position to the FIG. 5 position and the distal tip of the auxiliary linkage portion 28g moving downwardly sliding along the vertical portion of lower linkage portion 28b. Since the contact portions 28f are inclined in their at rest, original state, with the outer part of the contact portion 28f being slightly higher than the inner part as shown in FIG. 7, the distal end portion of the terminal leads 32 are wiped as the contact portions 28f move downwardly, with a result that oxide film of the terminal leads is peeled, thereby obtaining a satisfactory electrical connection between the two. FIG. 5 shows the loaded state of the socket with an electrical connection being established between an IC package and the socket. The IC package is subjected to a burn-in test in this state. During the course of the burn-in test, electric current flows between contact portions 28f and the lower linkage portion through the straight line spring portions 28e, bent spring portions 28d and horizontal linkage portions 28c as well as through auxiliary linkage portions 28g. In this manner, the auxiliary linkage portions 28g supplement the spring force of the contact elements 28 and, at the same time, function as an electric current bypass.

When it is desired to remove IC package 30 from the socket it is only necessary to press cover 14 toward base 10. This causes the linkage mechanism to engage in an opening movement as described earlier, with the latch 48 moving back from the position of engagement with contact portions 28f to an obliquely upward recessed position and, at the same time, the movable support arms 50 move up from cavity 52 to lift IC package 30. As seen in FIG. 7, the IC package can then be picked up with tweezers or the like.

In this embodiment, a linkage mechanism comprising a drive shaft 26, first levers 36 and second levers 38 engage in a forward or opening movement by using the downward force on cover 14 as the driving force, as described above, and latch 48 moves from the first position in engagement with contact elements 28, 28' to an obliquely upward, receded second position in dependence upon the movement of the linkage mechanism and, at the same time, the movable support arms 50 move up from inside cavity 52 to the position at a selected vertical location, thereby making it possible for the IC package to be inserted into the socket.

When an IC package 30 is loaded while being guided by the corner guide walls 11, the movable support arms 50 receive the lower surface of the IC package 30 immediately before the terminal leads 32 of IC package 30 touch the contact elements 28, 28'. As a result of this, the terminal leads 32 of IC package 30 are not damaged or deformed as it avoids impacts incident to a falling movement.

When the downward force on cover 14 is removed, cover 14 rises due to the return force of compression coil springs 12. Movable support arms 50, while carrying the IC package 30, guide the terminal leads until they reach the position for riding on corresponding contact elements 28, 28' at the IC package loading position and, at the same time, latch 48 moves from the second receded position to the first position in engagement with terminal leads 32 disposed on contact elements 28, 28' in such a fashion as to hold terminal leads 32 with an additional force between each terminal lead 32 and its respective contact elements 28, 28' due to the compressive force from latch 48. Thus, terminal leads 32 of IC package are positioned above and in alignment with respective corresponding contact elements 28, 28', followed by a soft landing on the contact portion 28f of contact elements 28, 28' due to the guidance of the movable support arms 50. As a result, each terminal lead 32 is accurately positioned to ride on its respective contact element 28, 28' obtaining an electrical connection therewith.

According to the socket of this embodiment, there is provided a mechanism in which the terminal leads 32 of the IC package 30 ride on contact elements 28, 28' as described above, with latch 48 moving diagonally downwardly from above, thereby providing additional contact force with contact elements 28, 28'. Further, the linkage mechanism for driving latches 48 (including drive shaft 26, first levers 36 and second levers 38) is arranged within the foot print defined by latches 48. Because of this, the operating force can be greatly reduced and, at the same time, a significant reduction can be realized in the socket size and in the width of the socket (the direction which is perpendicular to the direction of the contact elements arrangement).

In view of the fact that the linkage mechanism of the socket described in this embodiment is symmetrical on both sides of the socket with the drive shaft 26 as the center, the first levers 36 and the second levers 38 engage in the same action at the same time even if the cover 14 should be pressed down in a skewed orientation, with a consequence that latch 48 on each side and movable support arms 50 also engage in the same action at the same time. Accordingly, IC package 30 will maintain a horizontal position with an additional contact force exerted between terminal leads 32 and contact elements 28, 28' which is balanced on both the right and left hand sides. Because of this, a highly reliable electric connection is obtained.

Figure 9A:
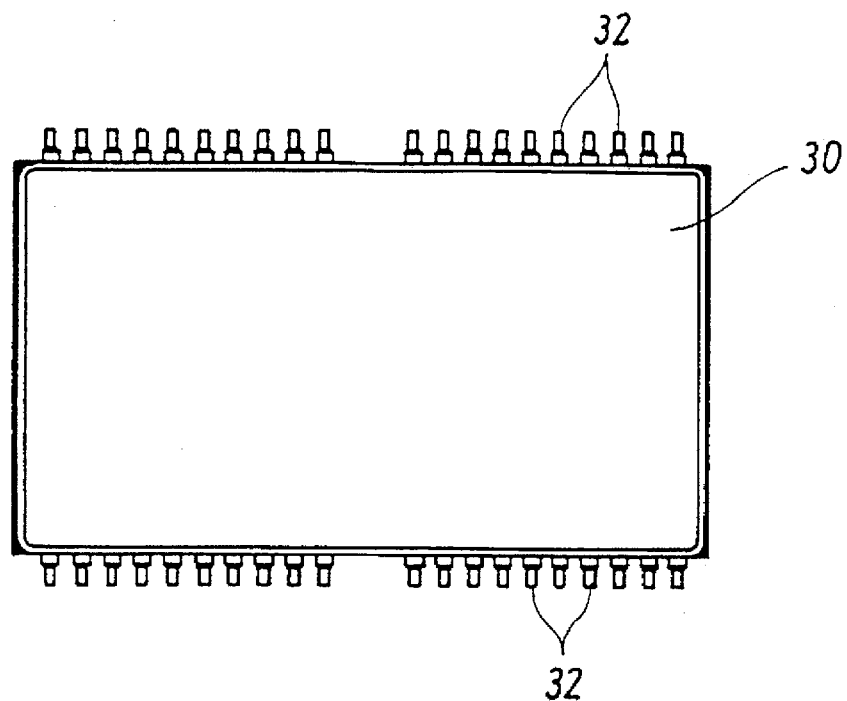
FIGS. 9(A), 9(B) and 9(C) are top, side and end views respectively of an IC package 30 of the SOP type capable of being loaded in the FIG. 1 socket.
Figure 9B:
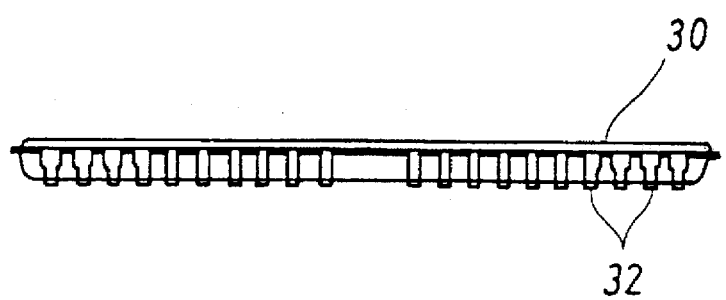
Figure 9C:
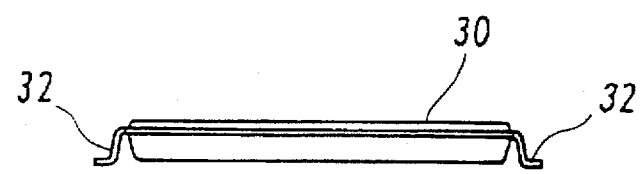
Figure 10:
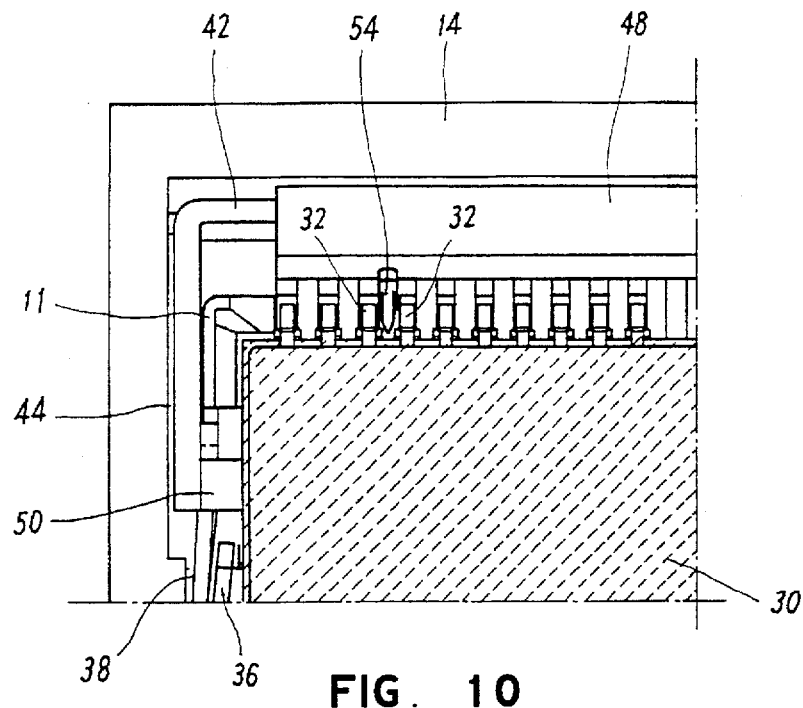
FIG. 10 is a partial top plan view showing an embodiment of the invention in which a positioning member is integrally formed with the latch member.
Figure 11:
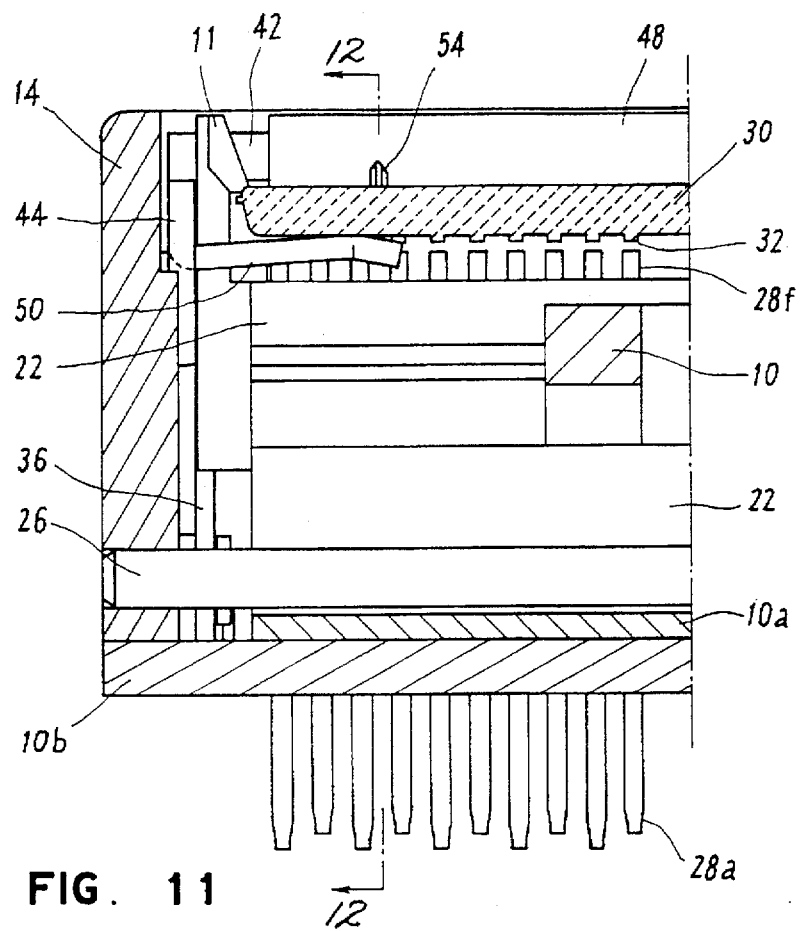
FIG. 11 is a partial cross sectional view similar to the left half of FIG. 8 showing a positioning member integrally formed with the latch member.
Figure 12:
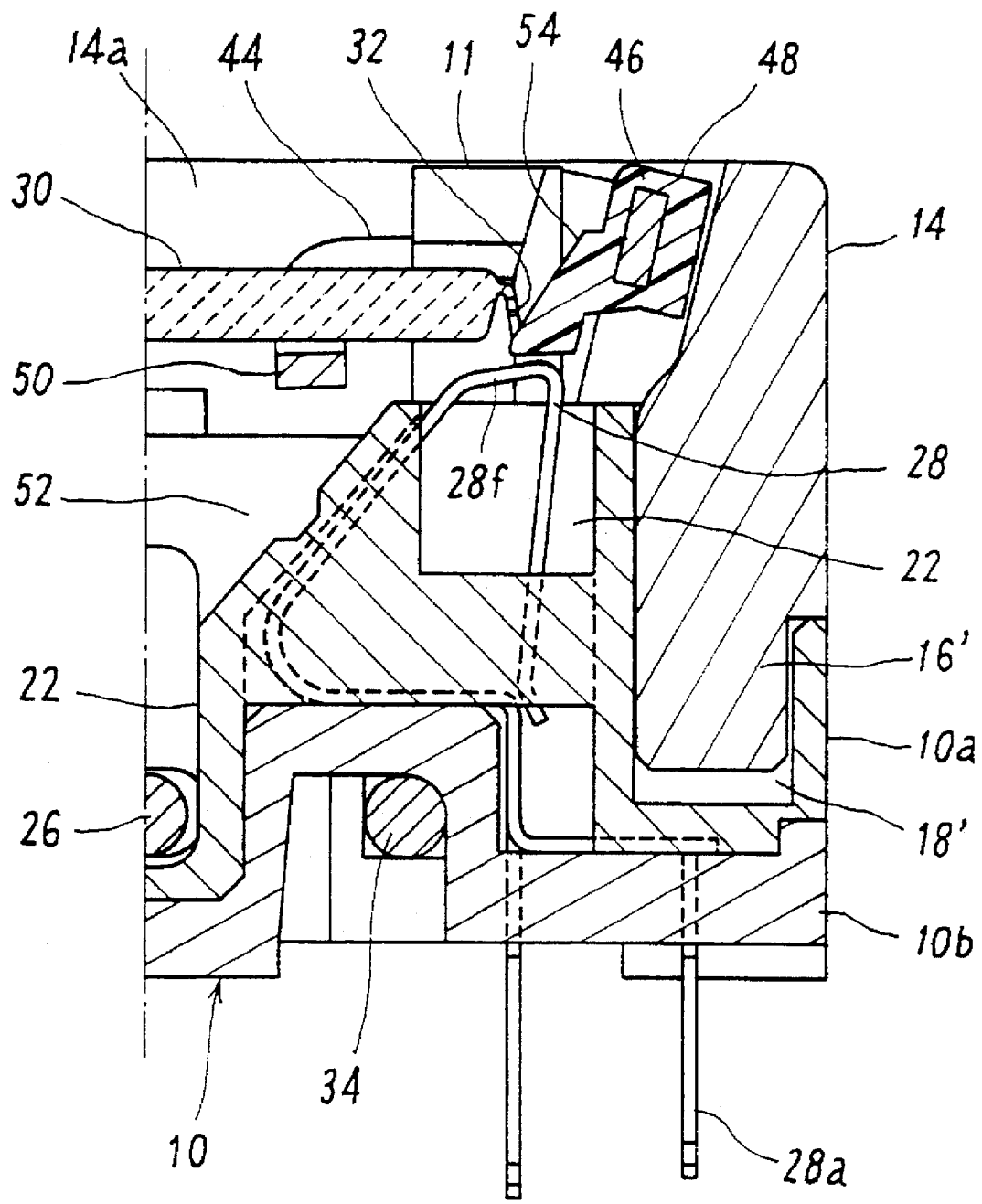
FIG. 12 is a cross sectional view taken on line 12—12 in FIG. 11.
Figure 13:
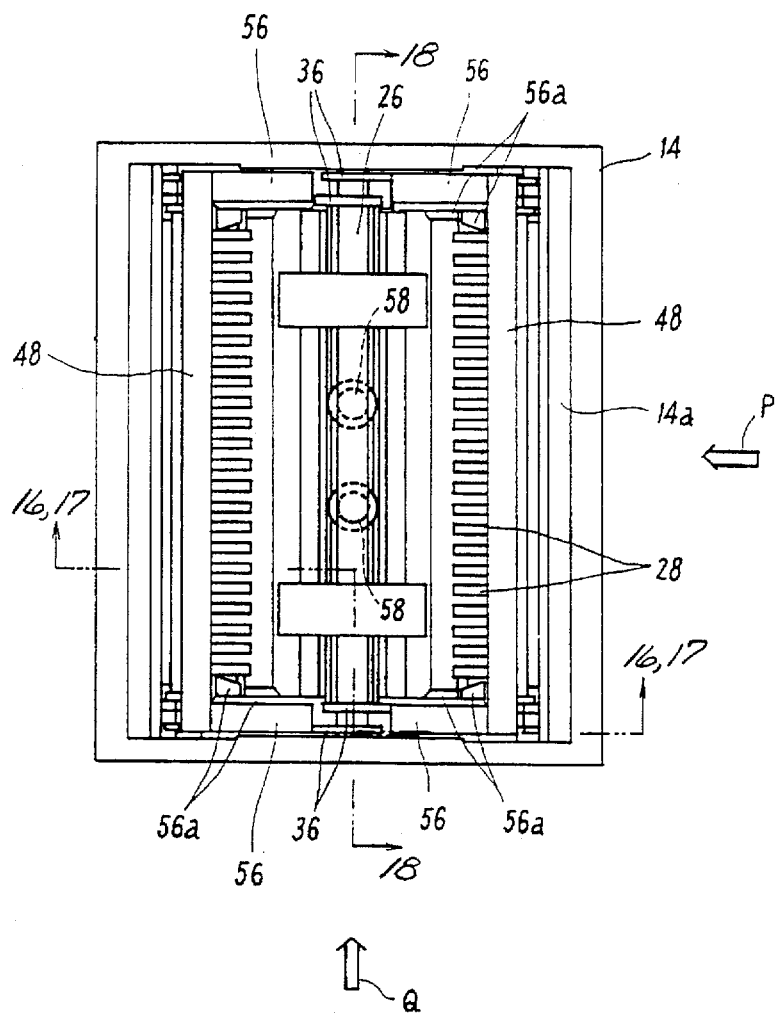
FIG. 13 is a top plan view of a socket made in accordance with another embodiment of the inventions.
Figure 14:
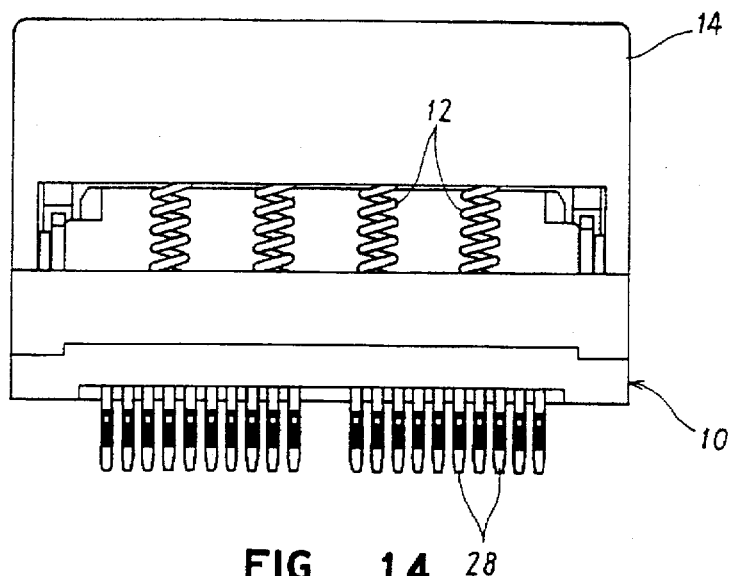
FIG. 14 is a side elevational view of the FIG. 13 socket made from the direction of arrow P in FIG. 13.
Figure 15:
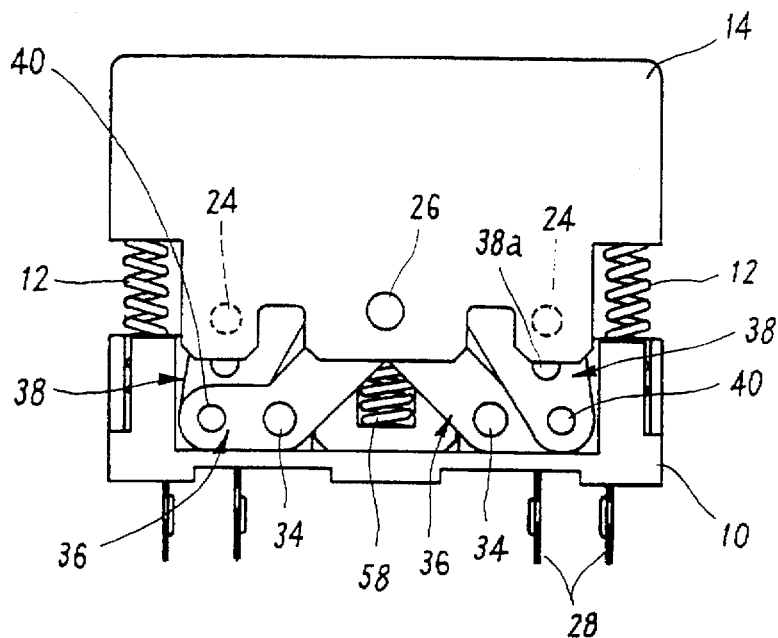
FIG. 15 is a front elevational view of the FIG. 13 socket taken from the direction of arrow Q in FIG. 13.
Figure 16:
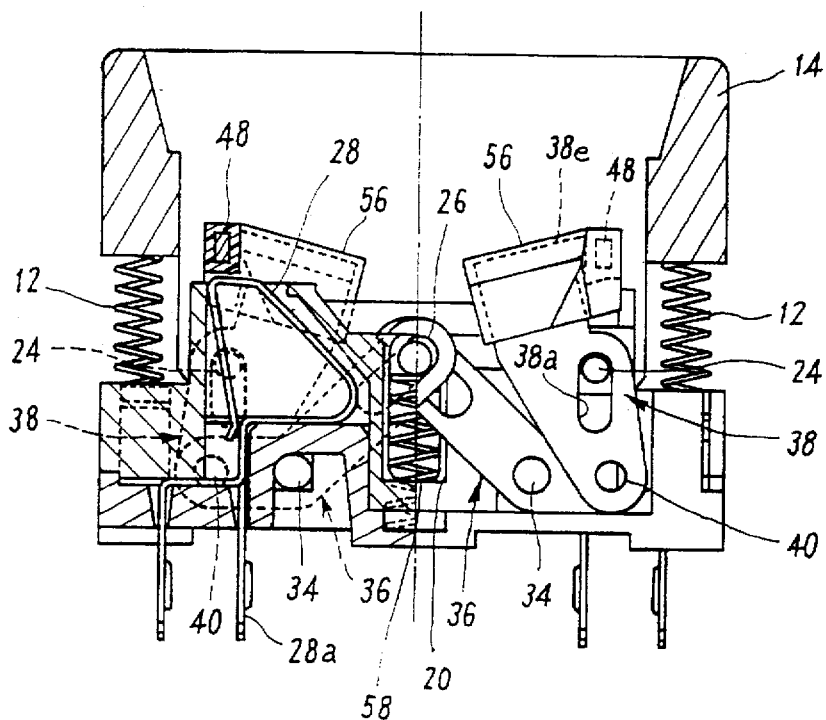
FIG. 16 is a cross sectional view taken on line 16,17—16,17 in FIG. 13 with the cover at its at rest, original positions.

FIGS. 10 through 12 show a modified embodiment of the FIGS. 1 through 9 embodiment in which a positioning member is provided on latch 48 for enhancing the accurate positioning of IC package 30 when the IC package is to be loaded. The positioning member in this embodiment comprises a protruding insulator finger 54 which extends from the insulator cover 46 of latch 48 toward contact elements 28, 28'. Finger 54 is placed at a position to allow passage of the finger through the gap between two adjacent terminal leads 32 with the tip of the finger being made slimmer in a tapered fashion.

When cover 14 is pressed down, the protruding finger 54 is at a position higher than contact elements 28 as shown in FIGS. 11 and 12. Finger 54 passes through the gap between two adjacent terminal leads 32 which are the closest to finger 54 when the IC package 30 is loaded through opening 14a as it moves down along the inside inclined surfaces of corner guide walls 11. The two leads 32 between which finger 54 passes are thereby placed in alignment with respectively corresponding contact elements 28, 28' by the sliding engagement of the tapered tip of finger 54. The remaining leads 32 are therefore also aligned with and above the corresponding contact elements 28, 28'. It will be realized that the number, position and shape of fingers 54, are a matter of choice.

FIGS. 13 through 18 show another modified embodiment of the invention. According to a feature of the socket in this embodiment, corner guide walls 56 are integrally attached to latch 48 for guiding the corner portions of the IC package 30 when the IC package is being loaded. The corner guide walls 56 comprise thick insulative material disposed on the top part 38e of second levers 38. An inclined surface 56a (FIG. 18) is formed on the inner surface of corner guide walls 56 for guiding purposes.

Figure 17:
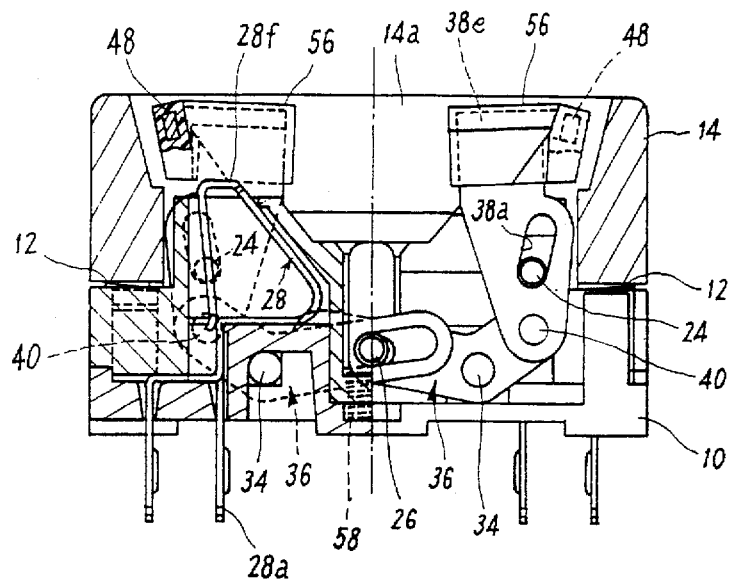
FIG. 17 is a cross sectional view taken on line 16,17—16—17 in FIG. 13 with the cover at its pushed down lower position.
Figure 18:
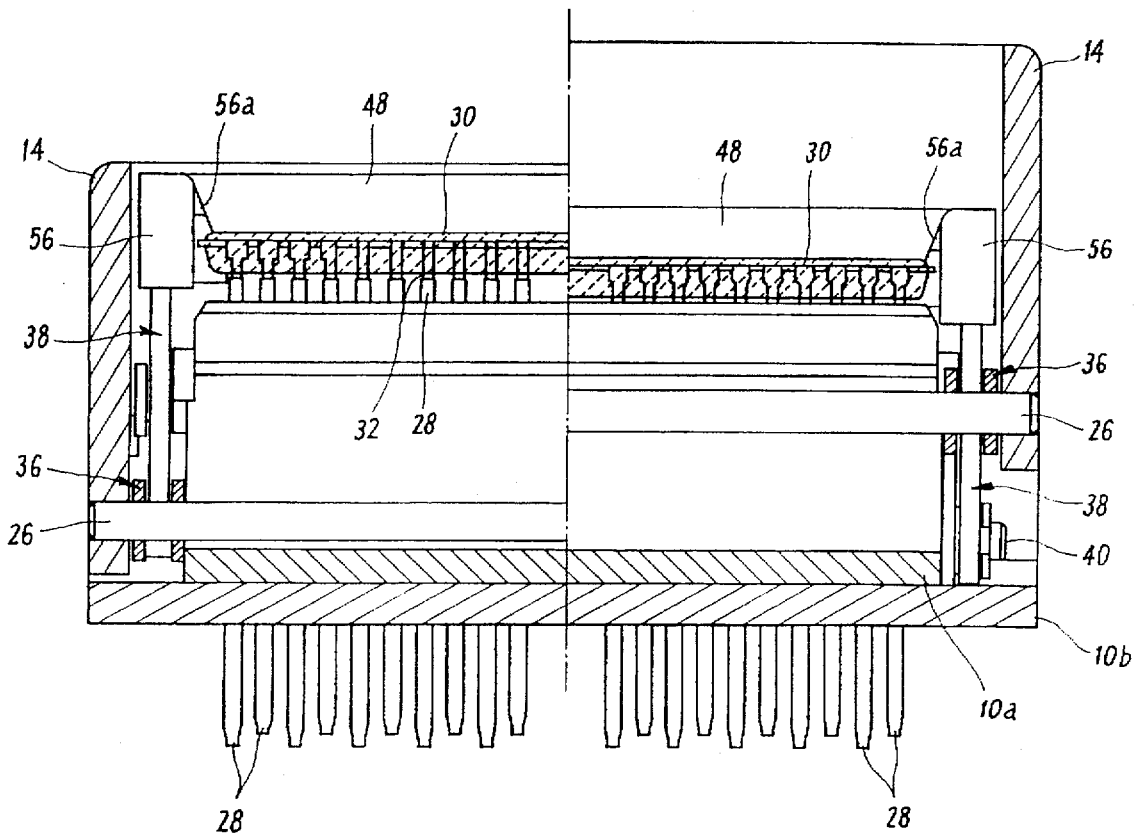
FIG. 18 is a cross sectional view taken on line 18—18 in FIG. 13 with the cover at its at rest, original position (right half) and at its pushed down lower position (left half)
Figure 19:
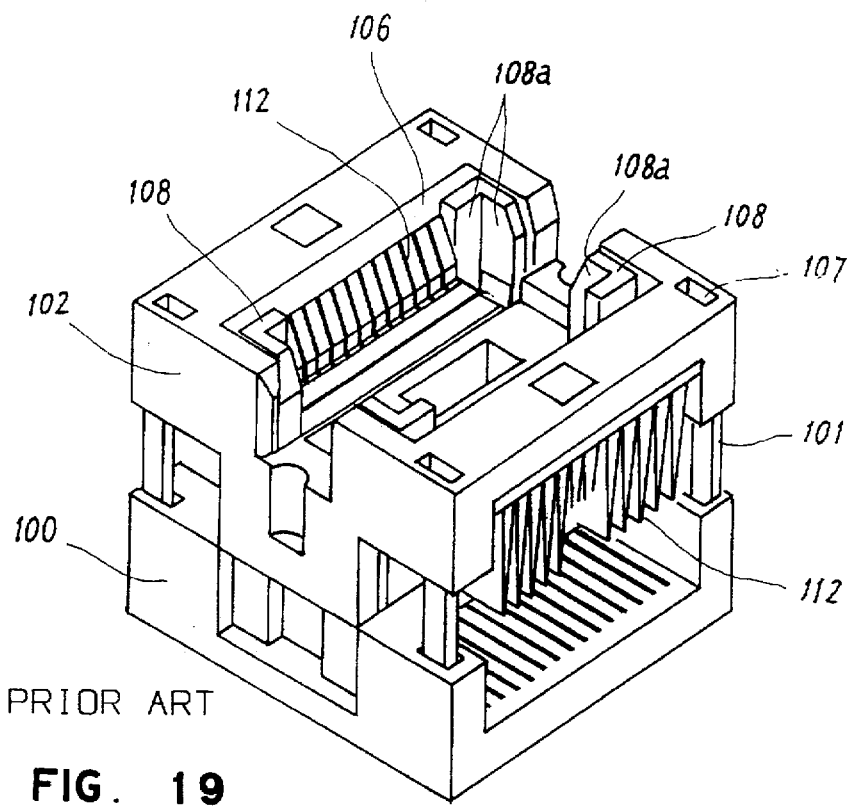
FIG. 19 is a perspective view of a prior art burn-in test socket.
Figure 20:
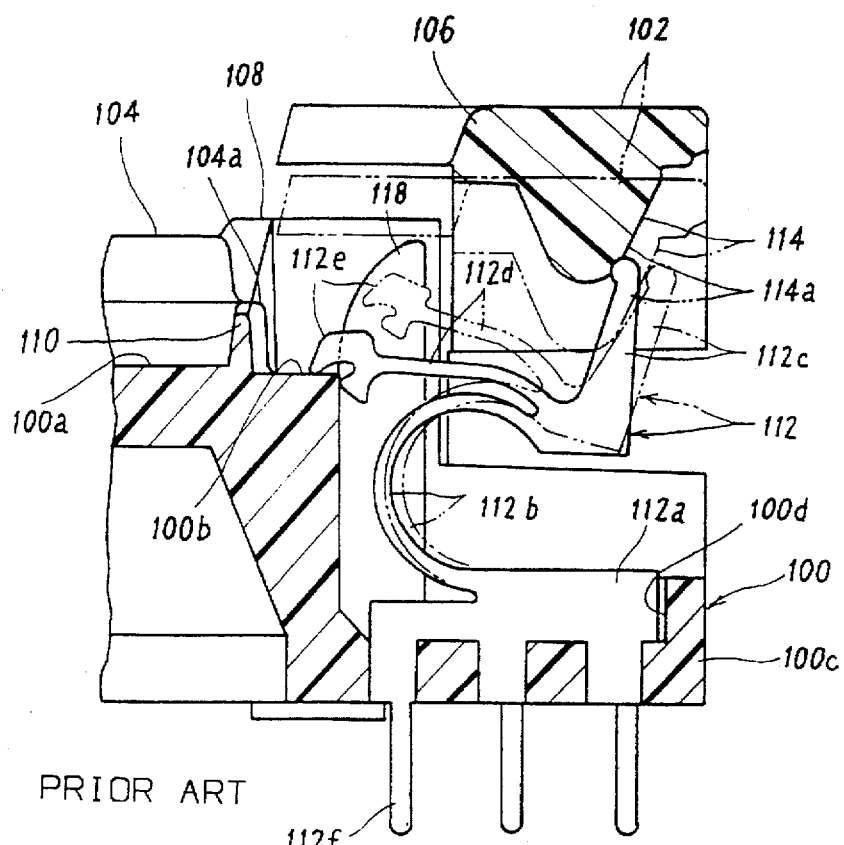
FIG. 20 is a partial vertical cross sectional view showing the inner construction of a socket made according to prior art technology.

As shown in FIG. 17, when the cover 14 is pushed down and latch 48 moves from the contact elements 28 diagonally upwardly, the corner guide walls 56 also move slightly in an obliquely upwardly direction from the contact elements 28, with a result that the inclined surface 56a assumes a selected angle at a selected location. When the IC package is loaded from above, the corner portions of the IC package slide along one or more of the inner inclined surfaces 56a of the corner guide walls 56 in their descent, with a result that the IC package 30 is guided to the position of the contact elements 28, 28'.

In this socket, a compression coil spring 58 is disposed under drive shaft 26, thereby increasing the drive force of the return movement of the linkage mechanism. Although not shown in FIGS. 13–18, movable support arms 50, described in relation to the FIGS. 1–8 embodiment above, may be provided if desired.

Since corner guide walls 56 as described above are provided integrally with latch 48 in the socket of this embodiment, it becomes possible to simplify and reduce the size of the base 10, which leads to a further reduction of the size of the socket as a whole.

In the above described embodiment, a socket for the burn-in test has been described which is suitable for the loading of an IC package 30 of the SOP type having a lead terminal arrangement pattern as shown in FIG. 9. However, it will be understood that the invention is not limited to this socket construction alone. It can be changed or modified within the purview of the invention. For instance, the shape of contact elements 28, 28' may be changed in a number of ways. If desired, the auxiliary linking portion 28g may be omitted or a supplemental spring force may be added. Even the linkage mechanism that works in dependence upon the vertical movement of the cover 14 can be modified. For example, two drive shafts 26 can be employed or a rivet can be attached to cover 14 in lieu of the drive shaft, with the first levers 36 being rotatably installed thereon. Moreover, cover 14 may be omitted, if desired, with drive shaft 26 driven directly by means providing the downward force.

As noted, the above embodiments relate to a socket for the SOP type IC packages. However, the socket of this invention can be used for other IC packages or electric parts of various kinds having a plurality of leads extending from the side of the package. In addition to burn-in tests, the invention can also be applied to sockets which are to be used to perform an electric property test for the examination of input/output characteristics, pulse properties and the like of the IC package.

According to the socket of the invention described above, the latch member moves between a first position where it engages the contact elements in dependence upon the linkage mechanism and a second position removed from the contact elements and after loading of the electric part into the main socket body, the latch member moves from the second position back to the first position, and the terminal leads of the electric part are caused to engage the contact elements with additional force through the compressive force of the latch member. As a result of the invention, it becomes possible to obtain a large operating force even in the case of a socket having a small size.

Further, the provision of a movable support member integrally attached to the latch member results in the ability to guide the terminal leads without causing any damage thereto. The support member receives the lower surface of the packages of the electric part so that when the latch member moves from the second position to the first position by the return movement of the linkage mechanism, the movable support member, while carrying the electric part, moves down in dependence upon movement of the latch member, thereby guiding the electric part to a selected loading position.

The feature of the positioning finger integrally attached to the latch member to position the electric part by passing through the gap between adjacent terminal leads of the electric part as it is loaded onto the main socket body results in improved accurate positioning of the electric part.

The feature of a guiding means integrally attached to the latch member to guide the electric part to a selected position by sliding engagement with the edge portions of the package of the electric part when loading the electric part into the main socket body when the latch member is at its receded position enables a further reduction of the size of the socket.

In the embodiments in which a cover is provided vertically movable relative to the main socket body as a drive means for the linkage mechanism, the drive shaft can be provided to move up and down together with the cover at the center of the main socket body. Movement of the drive shaft is transmitted to latch members on both sides of the main socket body through respective lever members, thereby obtaining a stable and accurate additional contact force and optimum electric connection between each terminal lead of the electric part and a respective contact element by making it possible for the lever member and the latch member on both sides to perform the same action at the same time with the drive shaft as the center even if the cover should be pressed down in a skewed orientation.

Although exemplary embodiments of the invention have been disclosed for purposes of illustration, it will be understood that various changes, modifications and substitutions may be incorporated into such embodiments without departing from the spirit of the invention as defined by the appended claims.

What is claimed:

1. Socket apparatus for removably receiving an electric part having a package containing an electric circuit and a plurality of terminal leads extending from the package comprising:
   a base formed of electrically insulative material and having first and second opposed sides and first and second opposed ends,
   a cover movable between a first raised position away from the base and a second lowered position next to the base,
   a plurality of contact elements arranged along the first and second opposed sides of the base in a 1:1 relationship with the terminal leads of the electric pad, the contact elements formed of electrically conductive material having good spring characteristics and having movable contact portions extending along first and second rows, a linkage mechanism on each of the first and second sides of the base, each linkage mechanism having a first pair of levers having first and second ends and an intermediate portion and a second pair of levers having first and seconds ends and an intermediate portion, the intermediate portion of the first pair of levers rotatably mounted to the base, the second ends of the first pair of levers rotatably connected to the first ends of the second pair of levers, the first pair of levers having an elongated slot formed adjacent the first ends thereof, the second pair of levers having an elongated slot between the intermediate portions and the second ends thereof, a shaft fixedly connected to the cover and received through the slots in the first pair of levers and a respective rivet fixedly attached to the base and extending through a respective slot in the second pair of levers so that movement of the cover from the first position to the second position will cause the first pair of levers to pivot in one direction raising the second pair of levers and movement of the cover from the second position to the first position will cause the first pair of levers to pivot in an opposite direction lowering the second pair of levers, a latch comprising an elongated generally horizontally disposed bar having an electrically insulative outer surface extending between and attached to the second ends of the second pair of levers and movable into engagement with the contact portions of the contact elements imparting a force on the contact portions with movement of the cover from the second to the first position and out of engagement with the contact portions with movement of the cover from the first to the second position to provide a balanced force on the contact portions of each row thereof, and guide means to position said electric part having the plurality of terminal leads extending from two opposite sides of the part in the socket with each terminal lead received on a respective contact portion.

2. Socket apparatus according to claim 1 further including a movable support arm extending from each second end of the second pair of levers, each support arm having a portion extending from a respective second lever at one end of the base toward the opposite end of the base to receive an electric part thereon.

3. Socket apparatus according to claim 1 further including inclined guide surfaces attached to the base for guiding an electric part to a selected location in the socket apparatus.

4. Socket apparatus according to claim 1 further including inclined guide surfaces attached to each latch and movable therewith for guiding an electric part to a selected location in the socket apparatus.

5. Socket apparatus according to claim 1 further including at least one finger extending from at least one latch, each finger having a width less than the distance between adjacent terminal leads of an electric part and being in alignment with a space between first and second selected adjacent contact elements.

6. Socket apparatus according to claim 1 in which the contact portions, with the cover in the second lowered position, are inclined upwardly in a direction going from the center of the base toward the side of the base whereby an electric part terminal lead received on a respective contact portion will be wiped by the respective contact portion as the latch applies a force to the terminal leads while moving to the first position of the cover moving the contact portions toward a horizontal orientation.

7. Socket apparatus according to claim 1 in which the base is formed with a contact element chamber for each contact element and each contact element includes a vertically extending lower portion extending into the contact element chamber from a terminal portion, a horizontal portion extending from the lower portion received on a bottom wall of the base and extending toward the center of the base, an inclined portion extending from the horizontal portion up to the contact portion and an auxiliary, generally straight portion extending from the contact portion downwardly toward the vertically extending lower portion, the auxiliary portion sliding against the vertically extending lower portion in electrical engagement as the contact portion is moved by the latch.

8. Socket apparatus according to claim 1 in which the cover is configured as a frame having a centrally disposed electric part receiving opening.

9. Socket apparatus according to claim 1 in which a horizontally extending shaft receiving groove is formed in the center of the base extending along a line drawn between the first and second opposed ends and the shaft is horizontally disposed and moves vertically in the groove in moving with the cover between the first and second positions.

10. Socket apparatus according to claim 1 further including spring elements mounted between the base and the cover, the spring elements applying a bias to the cover toward the first position.

11. Socket apparatus for removably receiving an electric part having a package containing an electric circuit and a plurality of leads extending from the package comprising:

a base formed of electrically insulative material and having first and second opposed sides and first and second opposed ends, a plurality of contact elements arranged in a 1:1 relationship with the terminal leads of the electric part, the contact elements formed of electrically conductive material having good spring characteristics and having movable contact portions extending in a row, a linkage mechanism comprising a first lever having first and second ends and an intermediate portion and a second lever having first and second ends and an intermediate portion, the intermediate portion of the first lever rotatably mounted to the base, the second end of the first lever and the first end of the second lever rotatably connected to each other, the first lever having an elongated slot formed adjacent the first end thereof, the second lever having an elongated slot adjacent the second end thereof, a shaft received through the slots in the first lever and a pin fixedly attached to the base and extending through the slot in the second lever, force means to move the shaft between a first raised position and a second lowered position, movement of the shaft from the first position to the second position causing the first lever to pivot in one direction raising the second end of the second layer and movement of the shaft from the second position to the first position causing the first lever to pivot in an opposite direction lowering the second end of the second lever, a latch comprising an elongated generally horizontally disposed bar having an electrically insulative outer surface extending from the second end of the second lever and movable into engagement with the contact portions of the contact elements imparting a force on the contact portions with movement of the shaft from the second to the first position and out of engagement with the contact portions with movement of the shaft from the first to the second position; and guide means to position said electric part having the plurality of terminal leads extending therefrom so that each terminal lad is received on a respective contact portion.

12. Socket apparatus according to claim 11 further including a cover movable between a first raised position away from the base and a second lowered position next to the base with the shaft fixedly attached to the cover.

13. Socket apparatus according to claim 11 further including a movable support arm extending from the second end of the second lever to receive an electric part thereon.

14. Socket apparatus according to claim 11 further including an inclined guide surface attached to the latch and movable therewith for guiding an electric part to a selected location in the socket apparatus.

15. Socket apparatus according to claim 11 further including at least one finger extending from the latch, the finger having a width less than the distance between adjacent terminal leads and being in alignment with a space between selected first and second adjacent contact elements.

16. Socket apparatus comprising a main socket body for removably loading an electric part having a package that includes an electric circuit and a plurality of terminal leads that extend from the package, a plurality of contact elements disposed in the main socket body arranged for electric connection with the plurality of terminal leads of the electric part in a 1:1 relationship, a linkage mechanism movable in an alternating motion in response to a selected external force and a latch which, in dependence upon the linkage mechanism, moves between a first position where it engages the contact elements and a second position where it is removed from the contact elements, the electric part being receivable in or removable from the main socket body when the latch is in the second position and a support arm attached to the latch that receives the lower surface of the electric part package that has been mounted in the main socket body when the latch is at the second position and that moves down, while carrying the electric part with the movement of the latch from the second position to the first position, thereby guiding same to a selected electric part mounting position.

17. Socket apparatus according to claim 16 further comprising a positioning finger integrally attached to the latch, the finger having a width less than the distance between adjacent terminal leads of the electric part and being aligned with a space between adjacent contact elements, the finger passing through adjacent terminal leads to position the electric part at a selected location when the electric part is mounted in the main socket body.

18. Socket apparatus according to claim 16 further comprising guide means integrally attached to the latch which guides the electric part toward the electric part mounting position in sliding contact with a corner of the package of the electric part when the electric part is placed into the main socket body when the latch is at the second position.

19. Socket apparatus according to claim 16 further comprising a vertically movable cover, a spring placing a force on the cover in a direction away from the main socket body, the linkage mechanism being connected to the cover, and, when the cover is moved downwardly by a downward force in opposition to the spring, the linkage mechanism engages in one movement and, when the cover rises to its at rest, original position by the return force of the spring when the downward force is removed, the linkage mechanism engages in an opposite, return movement.

20. Socket apparatus according to claim 19 further including a drive shaft fixedly mounted to the cover and movable with the cover approximately at the center of the main socket body and a pair of lever means having first and second ends which are rotatably mounted on the main socket body on both sides of the drive shaft, with the first end of the lever means linked to the drive shaft and the second end of the lever means linked to the latch.

21. Socket apparatus according to claim 19 further including a drive shaft fixedly mounted to the cover and movable with the cover approximately at the center of the main socket body, a pair of first lever members that are rotatably mounted on the main socket body, one on each side of the drive shaft, the first lever members each having first and second ends with the first end linked to the drive shaft, and a pair of second lever members rotatably and slidingly mounted on the main socket body, the second lever members each having first and second ends with the first end linked to the second end of the respective first lever members and the second end of the second pair of lever members linked to the latch member.

* * * * *